United States Patent [19]

Egerbacher et al.

[11] 4,218,695
[45] Aug. 19, 1980

[54] SEMICONDUCTOR RECTIFIER HOUSING ASSEMBLY

[75] Inventors: Werner Egerbacher; Heinz Martin; Werner Mitzkus, all of Munich; Dieter Wunderlich, Geiselbullach, all of Fed. Rep. of Germany

[73] Assignee: Siemens Aktiengesellschaft, Berlin and Munich, Fed. Rep. of Germany

[21] Appl. No.: 916,197

[22] Filed: Jun. 16, 1978

[30] Foreign Application Priority Data

Jun. 23, 1977 [DE] Fed. Rep. of Germany ....... 2728313

[51] Int. Cl.² .................... H01L 23/42; H01L 23/44; H01L 23/46
[52] U.S. Cl. .................... 357/79; 357/75; 357/81; 357/72
[58] Field of Search ............... 357/74, 75, 76, 79, 357/81, 72

[56] References Cited

U.S. PATENT DOCUMENTS

| 3,644,797 | 2/1972 | Carter | 357/79 |
| 4,047,197 | 9/1977 | Schierz | 357/75 |
| 4,079,410 | 3/1978 | Schierz | 357/75 |
| 4,106,052 | 8/1978 | Schierz | 357/75 |

*Primary Examiner*—Andrew J. James

*Attorney, Agent, or Firm*—Herbert L. Lerner

[57] ABSTRACT

Semiconductor component includes a closed housing having a base and a cover and being formed with a plurality of recesses therewithin, a plurality of semiconductor elements received in the recesses, respectively, and having at least two poles, a plurality of contact strips heat-conductively connected to and electrically insulated from the housing base, one of the poles of each of the semiconductor elements being in contact with a respective one of the contact strips and therethrough being in heat-conductive contact with the housing base, a plurality of supply electrodes, respectively, connected to another of the poles of the respective semiconductor elements, the respective contact strip in contact with a respective pole of one of the semiconductor elements and the respective supply electrode connected to a respective pole of another of the semiconductor elements being electrically connected to one another, a cross-piece disposed in the housing between the recesses wherein the semiconductor elements are received, and means secured to the crosspiece for yieldably biasing the supply electrodes against the semiconductor elements, the contact strips and the contact electrodes extending out of the housing and forming terminals for the respective semiconductor elements.

5 Claims, 1 Drawing Figure

U.S. Patent
Aug. 19, 1980
4,218,695
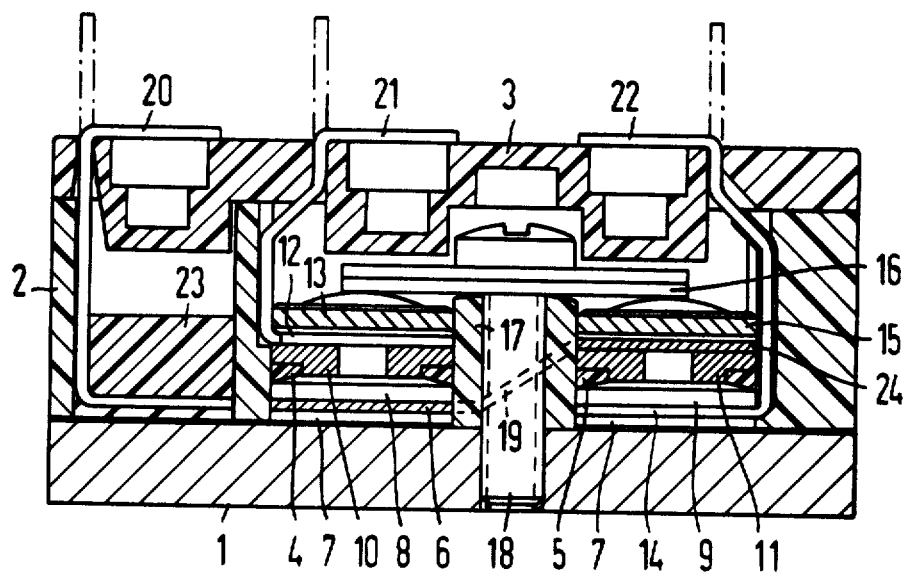

SEMICONDUCTOR RECTIFIER HOUSING ASSEMBLY

The invention relates to a semiconductor component having a plurality of semiconductor elements received in recesses formed within a closed housing having a base and a cover and which are in thermal contact with the base.

A heretofore known semiconductor component of this general type has a housing formed entirely of insulating material, and rectifier elements are received in recesses formed therein and have two leads which extend out of each recess. A semiconductor component of the aforementioned type having a housing formed of metal has also been disclosed heretofore. The latter housing is provided with several recesses which are lined with insulating material, and a semiconductor element is received in each of the recesses. A series connection is attained by stacking such semiconductor components one above the other. By disposing the semiconductor elements in several recesses, a parallel connection of the semiconductor elements can be formed.

The disclosed semiconductor components can easily be used as one-way or half-wave rectifiers. However, the construction of a bridge circuit, for example, requires either an expense or outlay for outer circuit technology or engineering or is unable to be effected without any major construction alterations as for the last-described semiconductor component.

It is an object of the invention to provide a semiconductor component of the aforedescribed type which is suitable for various application such as, for example, a branch of a rectifier bridge or a series connection, the semiconductor component being constructed as simply as possible and having as little expense or outlay as possible for interior circuit technology or engineering.

With the foregoing and other objects in view, there is provided in accordance with the invention, a semiconductor component comprising a closed housing having a base and a cover and being formed with a plurality of recesses therewithin, a plurality of semiconductor elements received in recesses, respectively, and having at least two poles, a plurality of contact strips heat-conductively connected to and electrically insulated from the housing base, one of the poles of each of the semiconductor elements being in contact with a respective one of the contact strips and therethrough being in heat-conductive contact with the housing base, a plurality of supply electrodes, respectively, connected to another of the poles of the respective semiconductor elements, the respective contact strip in contact with a respective pole of one of the semiconductor elements and the respective supply electrode connected to a respective pole of another of the semiconductor elements being electrically connected to one another, a crosspiece disposed in the housing between the recesses wherein the semiconductor elements are received, and means secured to the crosspiece for yieldably biasing the supply electrodes against the semiconductor elements, the contact strips and the contact electrodes extending out of the housing and forming terminals for the respective semiconductor elements.

In accordance with another feature of the invention, a respective contact strip and a respective supply electrode are formed together of a single strip-like metal member having a crank formed therein so that the respective contact strip and the respective supply electrode are disposed in different planes.

In accordance with a further feature of the invention, the yieldably biasing means comprise at least one spring, and including a threaded fastening means extending through the crosspiece and substantially perpendicularly to the housing base for securing the spring to the crosspiece.

In accordance with an added feature of the invention, the crosspiece is integral with the housing.

In accordance with an additional feature of the invention, the semiconductor elements are thyristor wafers having a respective control electrode, and including a respective pressure plate located at a side of the respective control electrode and leaving the respective control electrode exposed, the respective pressure plate being formed with an opening for the respective control electrode.

In accordance with yet another feature of the invention, a respective contact strip and a respective supply electrode consist together of an integral strip-like metal member formed with an opening therein, the crosspiece extending through the opening.

In accordance with a concomitant feature of the invention, the housing base is formed as a cooling body.

Other features which are considered as characteristic for the invention are set forth in the appended claims.

Although the invention is illustrated and described herein as embodied in semiconductor component, it is nevertheless not intended to be limited to the details shown, since various modifications and structural changes may be made therein without departing from the spirit of the invention and with the scope and range of equivalents of the claims.

The construction and method of operation of the invention, however, together with additional objects and advantages thereof will be best understood from the following description of specific embodiments when read in connection with the accompanying single FIGURE of the drawing which is a cross-sectional view of the semiconductor component of the invention.

Referring now to the drawing, there is shown therein the semiconductor component according to the invention which is provided with a housing having a base 1, a lateral wall 2 and a cover 3. The base 1 is formed of a highly heat-conductive metal, such as aluminum or cooper, whereas the wall and the cover are formed of insulating material. The wall 2, for example, can be secured adhesively to the base 1 or can be tightly connected to the base 1 in any other conventional manner. The cover 3 can, for example, be screwed onto the wall 2. The wall 2 may also be formed of metal lined with insulating material.

Within the housing 1, 2, 3, recesses 4 and 5 are defined. On the base 1 of the housing which also defines the base of each recess 4, 5, there is provided a layer 7 formed of highly heat-conductive, yet electrically-insulating material, such as beryllium oxide, for example. Contact strips 6 and 14, respectively, are disposed on the layers 7. The contact strips 6 and 14 can be merely placed on top of the layers 7.

In the recesses 4 and 5, respective semiconductor elements 8 and 9 are disposed on top of the contact strips 6 and 14, respectively. The semiconductor elements 8 and 9 are seated with one pole thereof on the contact strips 6 and 14, respectively. Metal pressure plates 10 and 11 formed with a central bore are disposed, respectively, on the other pole of the respective semiconductor elements 8 and 9. Furthermore, the pressure plates 10 and 11 are formed with non-illustrated lateral openings through which control lines are extended if the semiconductor elements 8 and 9 are provided with control electrodes (not shown). If the semiconductor elements 8 and 9 are simple rectifier wafers, the pressure plates 10 and 11 may be omitted.

Supply electrodes 12 and 24 are, respectively seated on the pressure plates 10 and 11. The supply electrode 24 and the contact strip 6 are formed of a single strip-like metal member having a crank or throw 19 formed therein. The crank 19 is of such construction that the contact strip 6 and the supply electrode 24 are disposed in different planes, for example, parallel to one another, as is readily apparent from the FIGURE of the drawing.

The two supply electrodes 12 and 24 are covered by insulating elements 13 and 15, respectively, whereon the ends of two leaf springs 16 are superimposed. Depending upon the circumstances, a single leaf spring may be sufficient or other springs, such as saddle springs, for example, may be used. The springs 16 are seated at the middle thereof on a crosspiece or ledge 17 which is formed of insulating material. The crosspiece 17 may be part of the housing wall 2; it can, however, also merely be fixed to the latter or to the base 1. The crosspiece 17 is formed with an opening or bore extending perpendicularly to the base 1 and having a screw 18 inserted therethrough. With the aid of the screw 18 and a non-illustrated nut, the springs 16 are clamped or subjected to tension. The crosspiece 17 forms a stop, so that for a known spring characteristic and known spring travel, a definite pressure is applied to the semiconductor elements 8 and 9, the supply electrodes 12 and 24, the insulating elements 13 and 15 and the contact strips 6 and 14. This pressure expediently lies between 5 and 30 N/mm² ($\approx$50 and 300 kp/cm³) at the surface of the semiconductor elements 8 and 9.

The contact strip 6 and the supply electrode 24 are connected to a lead 20. The supply electrode 12 and the contact strip 14 are electrically and mechanically connected to respective leads 21 and 22. The leads 20, 21 and 22 extend to the outside through openings formed in the cover 3. The leads 20, 21, 22 may also be clamped to the upper side of the cover 2 by non-illustrated screws which, in turn, form the outer terminals of the semiconductor component of the invention.

The illustrated exemplary embodiment can be used as a branch of a rectifier bridge. Two of these semiconductor components according to the invention form a one-way rectifier bridge, and three of these semiconductor components can be connected to form a three-phase rectifier bridge. To this end, the semiconductor components, according to the invention, can be screwed onto a non-illustrated common cooling member by providing suitable non-illustrated bores in the base 1; in this regard, it is noted, that although the base 1 is made of conductive metal, it is potential-free. The leads 21 and 22 can be connected to one another by means of simple flat conductor bars. The lead 20 serves for supplying a-c voltage.

If the semiconductor component according to the invention is to be used as a series connection, the terminal 20 remains free.

Following the insertion of the semiconductor elements 8 and 9 and the assembly of the other current-carrying parts within the space defined by the base 1 and the wall 2 of the housing, the cover 3 is set in place as shown in the FIGURE of the drawing, the ends of the leads 20, 21 and 22 passing through corresponding openings formed in the cover 3. The initial location of the ends of the leads 20, 21 and 22 is shown in phantom in the FIGURE. Thereafter, the ends of the leads 20, 21 and 22 are bent through an angle of 90°. The cover 3 is accordingly pressed against the housing wall 2 because the leads 20, 21 and 22 are themselves retained through the biasing force of the springs 16 and the clamping action of the screw 18 and form an abutment or support. Before the housing 1, 2, 3 is sealed, it is advantageously filled with insulating material up to and just below the spring 16 whereby environmental influences or effects are withheld from the semiconductor elements 8 and 9 and the contacts of the leads 20, 21 and 22.

In the exemplary embodiment, the semiconductor elements 8 and 9 extend parallel to the base 1. The semiconductor elements 8 and 9 can, however, be inclined towards the base 1 in such a manner that the resultants of the forces applied to the semiconductor elements 8 and 9 intersect at a point located below the base 1. Consequently, the bending force acting upon the base 1 becomes smaller. The base 1 of the housing 1, 2, 3 can also be constructed as a cooling element per se instead of being assembled on a cooling element. Since the base is potential-free, it permits an universal use of the semiconductor component according to the invention, especially in connection with a liquid cooling system.

There are claimed:

1. Semiconductor component comprising a closed having having a base and a cover and being formed with a plurality of recesses therewithin, a plurality of semiconductor elements received in said recesses, respectively, and having at least two poles, a plurality of contact strips heat-conductively connected to and electrically insulated from said housing base, one of said poles of each of said semiconductor elements being in contact with a respective one of said contact strips and therethrough being in heat-conductive contact with said housing base, a plurality of supply electrodes, respectively, connected to another of said poles of the respective semiconductor elements, the respective contact strip in contact with said one pole of one of said semiconductor elements and the respective supply electrode connected to said other pole of another of said semiconductor elements being formed together of a single strip-like metal member having a crank formed therein so that the respective contact strip and the respective supply electrode are disposed in different planes, a crosspiece integral with and disposed in said housing between said recesses wherein said semiconductor elements are received, and at least one spring held by said crosspiece for yieldably biasing said supply electrodes against said semiconductor elements in direction toward said base, add a threaded fastening means extending through said crosspiece and substantially perpendicularly to said housing base for securing said spring to said crosspiece, said contact strips and said contact electrodes extending out of said housing and forming terminals for the respective semiconductor elements.

2. Semiconductor component according to claim 1 wherein said crosspiece is fix with said housing.

3. Semiconductor component according to claim 1 wherein said semiconductor elements are thyristor wafers having a respective control electrode, and including a respective pressure plate located at a side of the respective control electrode and leaving the respective control electrode exposed, the respective pressure plate being formed with an opening for the respective control electrode.

4. Semiconductor component according to claim 1 wherein said strip-like metal member is formed with an opening therein, said crosspiece extending through said opening.

5. Semiconductor component according to claim 1 wherein said housing base is formed as a cooling body.

* * * * *